United States Patent
Chen

(10) Patent No.: US 7,409,649 B2
(45) Date of Patent: Aug. 5, 2008

(54) SYSTEM AND METHOD FOR AUTOMATICALLY CALCULATING PARAMETERS OF AN MOSFET

(75) Inventor: Chun-Jen Chen, Guangdong (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 224 days.

(21) Appl. No.: 11/306,446

(22) Filed: Dec. 28, 2005

(65) Prior Publication Data

US 2006/0236272 A1    Oct. 19, 2006

(30) Foreign Application Priority Data

Dec. 30, 2004    (CN) .................. 2004 1 0091943

(51) Int. Cl.
  *G06F 17/50*    (2006.01)
(52) U.S. Cl. .................. 716/1; 716/4; 716/5
(58) Field of Classification Search .............. 716/1, 716/4–6; 257/213, 328, 341, 342, 350; 326/17, 326/21, 24; 438/14, 17, 197
See application file for complete search history.

(56) References Cited

U.S. PATENT DOCUMENTS

| | | | | |
|---|---|---|---|---|
| 5,818,260 | A * | 10/1998 | Kuo | 326/86 |
| 6,046,641 | A * | 4/2000 | Chawla et al. | 330/277 |
| 6,313,690 | B1 * | 11/2001 | Ohshima | 327/427 |
| 6,637,930 | B2 * | 10/2003 | Butchers et al. | 374/102 |
| 2004/0009643 | A1 | 1/2004 | Blanchard | |

* cited by examiner

*Primary Examiner*—Vuthe Siek
(74) *Attorney, Agent, or Firm*—Winston Hsu

(57) ABSTRACT

A system for automatically calculating parameters of an MOSFET is disclosed. The parameter calculating system runs in a computer. The parameter calculating system is used for receiving values input by the users, and for calculating parameters of the MOSFET according to the input values. The parameter calculating system includes a type selecting module (110), a value receiving module (120), a number determining module (130), a parameter calculating module (140), and a circuit netlist generating module (150). A related method is also disclosed.

3 Claims, 3 Drawing Sheets

SYSTEM AND METHOD FOR AUTOMATICALLY CALCULATING PARAMETERS OF AN MOSFET

FIELD OF THE INVENTION

The present invention relates to a system and method for automatically calculating parameters of an MOSFET.

DESCRIPTION OF RELATED ART

Metal-oxide-semiconductor field-effect transistors (MOSFETs) are widely used in the electronics industry for switching, amplification, filtering, and other tasks related to both analog and digital electrical signals. There are two general types of MOSFETs depending on a polarity of a dopant placed in various portions of the MOSFETs. The two types include an n-type and a p-type. That is, an MOSFET may be an n-type MOSFET (NMOS) or a p-type MOSFET (PMOS).

Conventionally, before building a model of the MOSFET, designers need to calculate parameters of the MOSFET one by one through lots of formulas. Manually calculation often occurs many mistakes that lead to inaccuracies of MOSFET models. Additionally, the manual calculation occupies plenty of times of the designers.

Furthermore, many power MOSFET models available today are based on an ideal lateral MOSFET device. They offer poor correlation between simulated and actual circuit performance in several areas. They have low and high current inaccuracies that could mislead power circuit designers. This situation is complicated by the dynamic performance of the model, especially for high-frequency applications of MOSFET models. In order to improve the accuracies of the MOSFET models, effects of the internal parasitic resistances of the MOSFETs must be taken into account. However, in conventional methods of building the MOSFET models, the internal parasitic resistances are often not taken into account.

Therefore, what is needed is a system and method for automatically calculating parameters of an MOSFET, which can not only shorten the period of calculating parameters of the MOSFET, but also take effects of internal parasitic resistances into account for improving the accuracy of an MOSFET model.

SUMMARY OF INVENTION

A system for automatically calculating parameters of an MOSFET in accordance with a preferred embodiment is provided. The parameter calculating system includes: a type selecting module is for selecting a type of the MOSFET, which maybe an n-type MOSFET or a P-type MOSFET; a value receiving module is for receiving values input by users; a number determining module is for determining if the number of values of Vgs equals the number of values of Id, and for determining if the number of values of Rds(on) equals the number of values of Tj; and a parameter calculating module is for calculating the parameters of the MOSFET according to the input values.

The system further includes a circuit netlist generating module for generating a circuit netlist of the MOSFET according to the calculated parameters.

Further, a preferred method for automatically calculating parameters of an MOSFET is also provided. The method includes the steps of: selecting an NMOS or a PMOS; receiving at least three sets of values of (Vgs, Id) when Tj=T; determining if the number of values of Vgs equals the number of values of Id; calculating values of a Kp, a Vt and a Rs; receiving one set of values of (Vt, Tj) when Tj≠T; calculating a temperature coefficient of Rvt; receiving values of a Vgs, a Id and at least one set of (Rds(on), Tj); determining if the number of values of Rds(on) equals the number of values of Tj; calculating values of a Rd and a temperature coefficient of Rd; receiving values of a Qgs, a Vplt, a 1/Beta, and two sets of values of (Crss, Vds); calculating values of a Cgs, a Cjo, a M and a Vj; receiving values of a Td(on), a Ciss, a Vt, a Vgdrv and a Rgdrv; and calculating the value of a Rg.

The method further includes a step of: generating a circuit netlist of the MOSFET according to all the calculated parameters.

Other objects, advantages and novel features of the present invention will be drawn from the following detailed description of the preferred embodiment and preferred methods of the present invention with the attached drawings, in which:

DETAILED DESCRIPTION

In order to describe the preferred embodiments conveniently, here we give the following technical terms: Vgs: gate-source voltage; Id: drain current; Kp: transconduct paratmeter; Vt: threshold voltage; Rvt: threshold resistance; Rs: source resistance; Tj: junction temperature; Rds(on): drain-source on-state resistance; Rd: drain resistance; Qgs: gate-source charge; Vplt: plateau voltage; Beta: slope in the third segment; Crss: reverse transfer capacitance; Vds: drain-source voltage; Cgs: gate-source capacitance; Cjo: Crss at Vds=0V; M: grading coefficient; Vj: junction voltage; Ciss: input capacitance; Td(on): turn-on delay time; Vgdrv: gate drive voltage; Rgdrv: gate drive resistance; and Rg: gate resistance.

Figure 1:
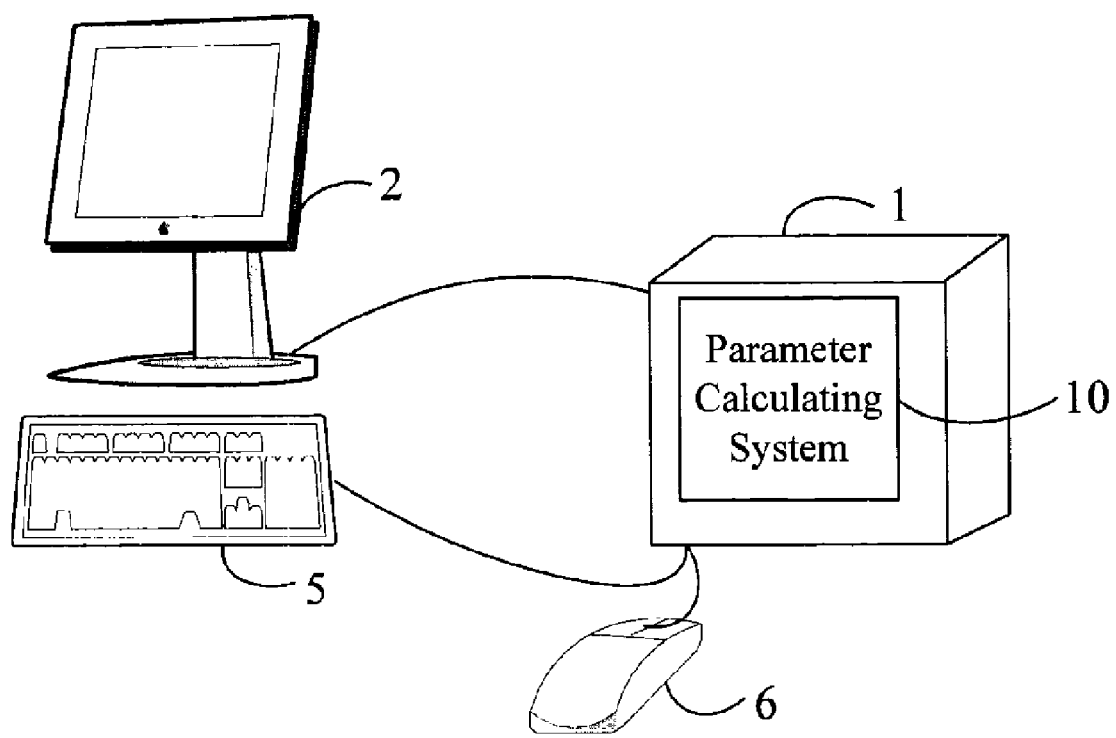
FIG. 1 is a schematic diagram of application environment for implementing a system for automatically calculating parameters of an MOSFET in accordance with a preferred embodiment.

FIG. 1 is a schematic diagram of an application environment for implementing a system for automatically calculating parameters of an MOSFET (hereinafter, "the parameter calculating system 10") in accordance with a preferred embodiment. The application environment includes a computer 1, a display 2 connected with the computer 1, a keyboard 5 and a mouse 6. Users input corresponding values through the keyboard 5 or the mouse 6. The parameter calculating system 10 runs in the computer 1, and is used for receiving the values input by the users, and for calculating parameters of the MOSFET according to the input values. Generally, temperature coefficients of parasitic resistances of the MOSFET are taken into account in order to improve the accuracy of MOSFET models. The parasitic resistances typically include Rvt and Rd. During calculating the parameters of the MOSFET, the parameter calculating system 10 employs corresponding formulas related to the MOSFET, which are stored in the computer 1.

Figure 2:
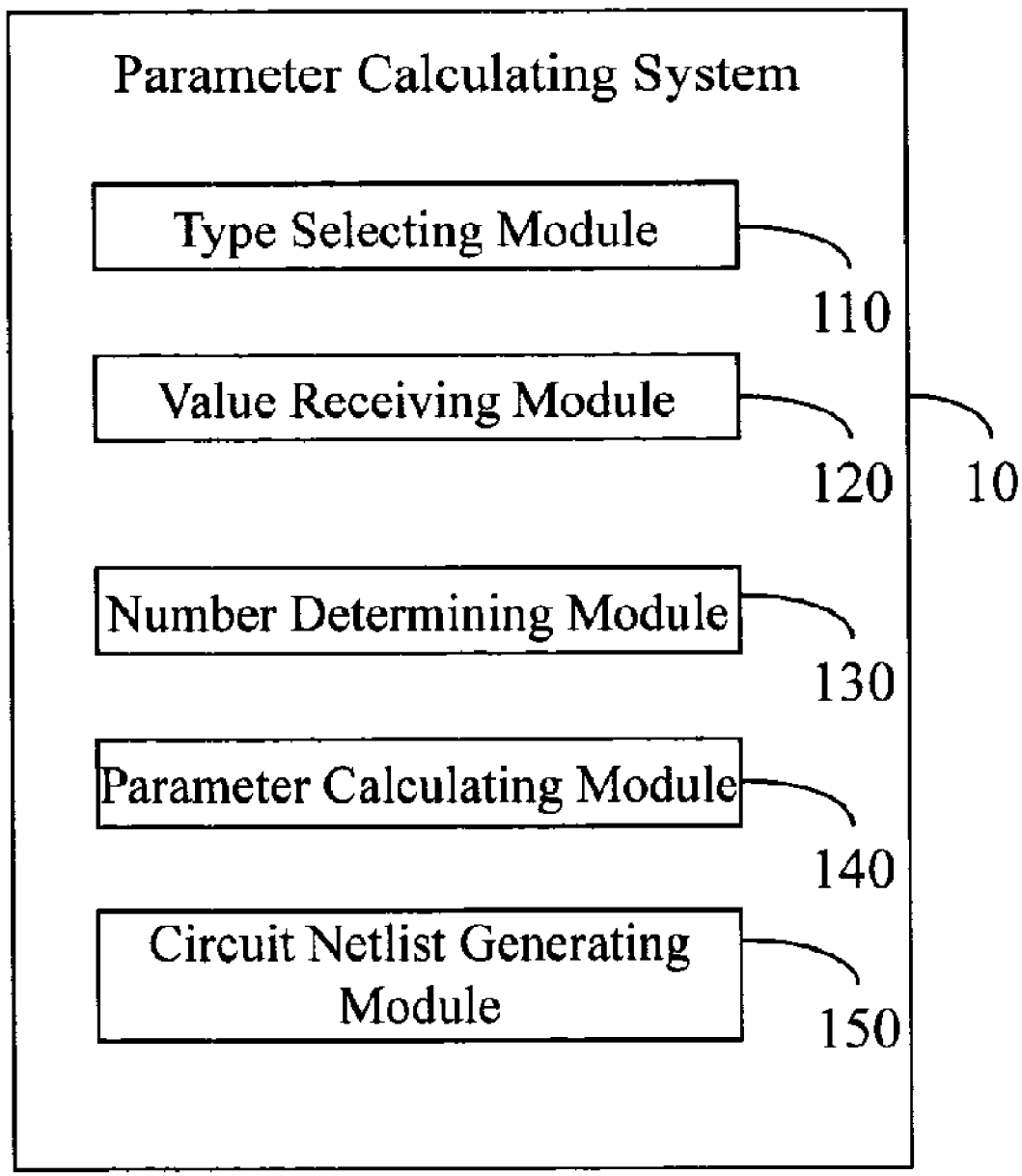
FIG. 2 is a schematic diagram showing function modules of the parameter calculating system of FIG. 1.

FIG. 2 is a schematic diagram showing function modules of the parameter calculating system 10. The parameter calculating system 10 includes a type selecting module 110, a value receiving module 120, a number determining module 130, a parameter calculating module 140, and a circuit netlist generating module 150. The type selecting module 110 is for users to select a type for an MOSFET. There are two general types of MOSFETs depending on a polarity of a dopant placed in various portions of each MOSFET. That is, the MOSFET maybe an n-type MOSFET (NMOS) or a p-type MOSFET (PMOS). The value receiving module 120 is for receiving values input by the users, which are needed in calculating parameters of the MOSFET. The values may include values of variables or variable sets as follows: (Vgs, Id), (Vt, Tj), (Rds(on), Tj), Qgs, Vplt, Beta, (Crss, Vds), Td(on), Ciss, Vt, Vgdrv, Rgdrv and so on. The number determining module 130 is for determining if the number of values of Vgs equals the number of values of Id, and for determining if the number of values of Rds(on) equals the number of values of Tj. The parameter calculating module 140 is for calculating the parameters of the MOSFET according to the values input by the users. The parameters may include, for example, Kp, Vt, Rs, a temperature coefficient of Rvt, Rd, a temperature coefficient of Rd, Cgs, Cjo, M, Vj and Rg. The circuit netlist generating module 150 is for generating a circuit netlist of the MOSFET according to the calculated parameters. The users can put the circuit netlist into SPICE (Simulation Program with Integrated Circuits Emphasis) software for constructing an MOSFET model for simulation.

Figure 3:
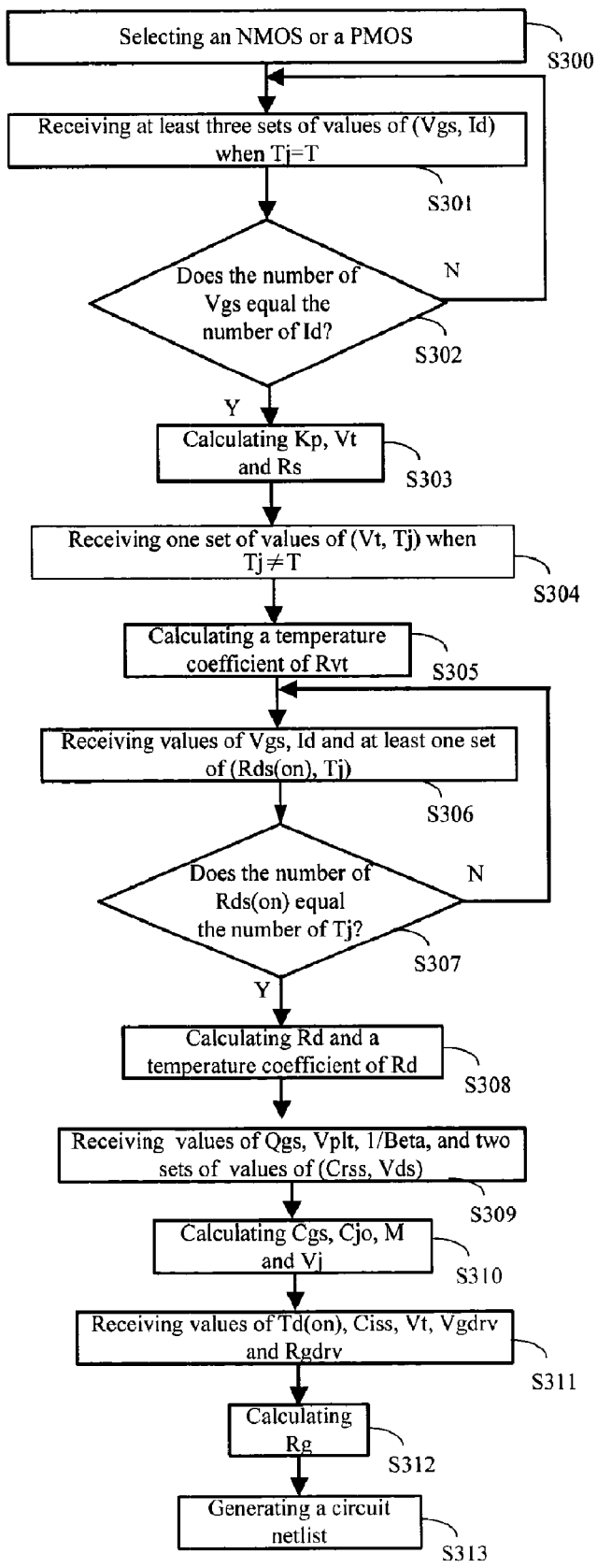
FIG. 3 is a flowchart of a preferred method for automatically calculating parameters of an MOSFET by utilizing the parameter calculating system of FIG. 1.

FIG. 3 is a flowchart of a preferred method for automatically calculating parameters of an MOSFET by utilizing the parameter calculating system 10 of FIG. 1. In step S300, the type selecting module 110 selects an NMOS or a PMOS. In step S301, the value receiving module 120 receives at least three sets of values of (Vgs, Id) when Tj=T. T maybe be, for example, 25° C. or any other value, which can be set according to particular requirements of users. In step S302, the number determining module 130 determines if the number of values of Vgs equals the number of values of Id. If the number of values of Vgs equals the number of values of Id, in step S303, the parameter calculating module 140 calculates values of a Kp, a Vt and a Rs by employing a formula 'Id=0.5*(Kp-Vgs-Vt-Rs*Id)$^2$'. When the value receiving module 120 receives three sets of values of (Vgs, Id), the parameters Kp, Vt and Rs can be rapidly calculated. Otherwise, if the number of values of Vgs does not equal the number of values of Id, the procedure returns to step S301. In step S304, the value receiving module 120 receives one set of values of (Vt, Tj) when Tj≠T. In step S305, the parameter calculating module 140 calculates a temperature coefficient of Rvt according to a corresponding formula stored in the computer 1. In step S306, the value receiving module 120 receives values of Vgs and Id, and at least one set of values of (Rds(on), Tj). In step S307, the number determining module 130 determines if the number of values of Rds(on) equals the number of values of Tj. If the number of values of Rds(on) equals the number of values of Tj, in step S308, the parameter calculating module 140 calculates the value of a Rd and a temperature coefficient of Rd according to respective formula. Otherwise, if the number of values of Rds(on) does not equal the number of values of Tj, the procedure returns to step S306. In step S309, the value receiving module 120 receives values of a Qgs, a Vplt, a 1/Beta, and two sets of values of (Crss, Vds). In step S310, the parameter calculating module 140 calculates values of a Cgs, a Cjo, a M and a Vj according to respective formula. In step S311, the value receiving module 120 receives values of a Td(on), a Ciss, a Vt, a Vgdrv and a Rgdrv. In step S312, the parameter calculating module 140 calculates the value of a Rg according to a corresponding formula. In step S313, the circuit netlist generating module 150 generates a circuit netlist of the MOSFET according all the calculated parameters.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A computer-based system for automatically calculating parameters of a metal-oxide-semiconductor field-effect transistor (MOSFET), the system comprising:
    a type selecting module for selecting a type of the MOSFET;
    a value receiving module for receiving corresponding values input by users from a keyboard;
    a number determining module for determining whether the number of values of gate-source voltage equals the number of values of drain current, and for determining whether the number of values of drain-source on-state resistance equals the number of values of junction temperature;
    a parameter calculating module for calculating the parameters of the MOSFET according to the input values by employing respective formulas stored in the computer, wherein the calculation comprises:
        calculating values of a transconduct parameter, a threshold voltage, and a source resistance according to received values of the gate-source voltage and the drain current being equal, and returning to perform the value module receiving module, if the two number of values determined are not equal;
        calculating a temperature coefficient of a threshold resistance according to received values of the threshold voltage and a junction temperature;
        calculating values of a drain resistance and a temperature coefficient of the drain resistance according to received values of drain-source on-state resistance and the junction temperature being equal, returning to perform the value module receiving, if the two number of values determined are not equal;
        calculating values of a gate-source capacitance and a reverse transfer capacitance when the drain-source voltage is zero according to received values of a gate-source charge, a plateau voltage, a 1/slope in the third segment, and at least two sets of values of (reverse transfer capacitance, drain-source voltage); and
        calculating a value of a gate resistance according to received values of a turn-on delay time, an input capacitance, a threshold voltage, a gate drive voltage, and a gate drive resistance; and
    a circuit netlist generating module for generating a circuit netlist of the MOSFET according to all of the calculated parameters, and for constructing a MOSFET model according to the circuit netlist.

2. The system according to claim 1, wherein the MOSFET is one of an n-type MOSFET and a p-type MOSFET.

3. A computer-based method for automatically calculating parameters of a metal-oxide-semiconductor field-effect transistor (MOSFET), comprising steps of:
    (a) selecting an n-type MOSFET or a p-type MOSFET;
    (b) receiving at least three sets of values of (gate-source voltage, drain current) when a junction temperature is equal to T;

(c) determining whether the number of values of gate-source voltage equals the number of values of drain current;

(d) calculating values of a transconduct parameter, a threshold voltage, and a source resistance according to respective formulas stored in the computer if the two numbers are equal;

(e) receiving one set of values of (threshold voltage, junction temperature) when a junction temperature is not equal to T;

(f) calculating a temperature coefficient of the threshold resistance according to a corresponding formula;

(g) receiving values of the gate-source voltage and the drain current, and at least one set of values of (drain-source on-state resistance, junction temperature);

(h) determining whether the number of values of drain-source on-state resistance equals the number of values of junction temperature;

(i) calculating a value of a drain resistance and a temperature coefficient of the drain resistance according to respective formulas stored in the computer if the two numbers are equal;

(j) receiving values of a gate-source charge, a plateau voltage, a 1/slope in the third segment, and at least two sets of values of (reverse transfer capacitance, drain-source voltage);

(k) calculating values of a gate-source capacitance, a reverse transfer capacitance when the drain-source voltage is zero, a grading coefficient, and a junction voltage according to respective formulas;

(l) receiving values of a turn-on delay time, an input capacitance, a threshold voltage, a gate drive voltage, and a gate drive resistance;

(m) calculating a value of a gate resistance according to a corresponding formula; and (n) generating a circuit netlist of the MOSFET according to all of the calculated parameters, and constructing a MOSFET model according to the circuit netlist wherein step (c) comprises a step of: returning to step (b) if the two number are not equal; and wherein step (h) comprises a step of: returning to step (g) if the two number are not equal.

* * * * *